United States Patent
Endou et al.

(10) Patent No.: US 6,759,928 B2
(45) Date of Patent: Jul. 6, 2004

(54) SURFACE ACOUSTIC WAVE DEVICE WITH DIVIDED INTERDIGITAL TRANSDUCERS

(75) Inventors: Gou Endou, Nagano (JP); Osamu Kawachi, Nagano (JP); Masanori Ueda, Nagano (JP); Motoyuki Tajima, Nagano (JP)

(73) Assignee: Fujitsu Media Devices Limited, Nagano (JP)

( * ) Notice: Subject to any disclaimer, the term of this patent is extended or adjusted under 35 U.S.C. 154(b) by 25 days.

(21) Appl. No.: 10/082,054

(22) Filed: Feb. 26, 2002

(65) Prior Publication Data

US 2002/0079988 A1 Jun. 27, 2002

Related U.S. Application Data

(63) Continuation-in-part of application No. PCT/JP01/05677, filed on Jun. 29, 2001.

(30) Foreign Application Priority Data

Jun. 30, 2000 (JP) .................................. 2000-199279

(51) Int. Cl.$^7$ ................................................ H03H 9/64
(52) U.S. Cl. .................... 333/193; 333/195; 310/313.8
(58) Field of Search .............................. 333/193–196; 310/313 R, 313 B, 313 C, 313 D, 313 A

(56) References Cited

U.S. PATENT DOCUMENTS

| 4,425,554 A | * | 1/1984 | Morishita et al. | ........... 333/195 |
| 5,936,488 A | * | 8/1999 | Taguchi et al. | ............. 333/195 |
| 6,037,847 A | * | 3/2000 | Ueda et al. | ................. 333/193 |
| 6,353,372 B1 | * | 3/2002 | Baier et al. | ................. 333/195 |

FOREIGN PATENT DOCUMENTS

| JP | 9-167936 | | 6/1997 |
| JP | 9-205342 | * | 8/1997 |
| JP | 10-173470 | * | 6/1998 |
| JP | 2000-91883 | | 3/2000 |
| JP | 2001-292050 | * | 10/2001 |
| WO | WO 98/57429 | * | 12/1998 |

* cited by examiner

Primary Examiner—Barbara Summons
(74) Attorney, Agent, or Firm—Arent Fox PLLC

(57) ABSTRACT

A surface acoustic wave device includes an input interdigital transducer and an output interdigital transducer, disposed on a surface acoustic wave propagation path of a piezoelectric substrate, wherein when an aperture length of an electrode finger of the input or output interdigital transducer is denoted by X, the output or input interdigital transducer has two divided interdigital transducers having the electrode finger in which each aperture length is denoted by substantially X/2, wherein the two divided interdigital transducers are serial-connected, and the electrodes of the respective electrode fingers are led from the two divided interdigital transducers, and are disposed so that two output and input signals connected to a balance terminal pair have a different phase at 180°.

6 Claims, 19 Drawing Sheets

SURFACE ACOUSTIC WAVE DEVICE WITH DIVIDED INTERDIGITAL TRANSDUCERS

This application is a continuation-in-part application of International Application No. PCT/JP01/05677, filed Jun. 29, 2001, designating the United States.

BACKGROUND OF THE INVENTION

1. Field of the Invention

The present invention relates to a surface acoustic wave device, and in particular to a surface acoustic wave device in which any one of an input and output has balanced or differential terminal pair.

2. Description of the Related Arts

The surface acoustic wave device is widely used as a filter in a high frequency circuit of a radio apparatus represented by a portable telephone or the like. In recent years, in the high frequency circuit of this radio apparatus, an integrated circuit element (IC) having a balanced or differential input and output has been used.

On the contrary, a filter using a conventional surface acoustic wave device (hereinafter appropriately referred to as a surface acoustic wave filter) is unbalanced in an I/O terminal. For this reason, for example, as shown in FIG. 1, in the case of connecting with a mixer circuit IC 3, an unbalanced-balanced transforming part which is called a balun, or a transformation circuit 2 constituted by separate parts is necessary between a surface acoustic wave filter 1 and the mixer circuit IC 3.

Furthermore, the surface acoustic wave filter normally has an I/O impedance of 50 Ω, and on the other hand, in many cases, an impedance of the mixer circuit IC 3, etc. having a balanced terminal pair is high up to about 100 to 200 Ω, and an impedance transformation circuit was required for connecting such the IC with the surface acoustic wave filter.

However, this leads to an increase in the number of using circuit parts in the radio apparatus. Furthermore, for a demand for more downsizing, a design for space-saving is demanded.

SUMMARY OF THE INVENTION

It is therefore an object of the present invention to realize a small-sized surface acoustic wave device having an unbalanced-balanced transformation function and a function of impedance transformation.

In order to achieve the above object, according to a first aspect of the present invention there is provided a surface acoustic wave device, comprising an input interdigital transducer and an output interdigital transducer, disposed on a surface acoustic wave propagation path of a piezoelectric substrate, wherein when an aperture length of an electrode finger of the input or output interdigital transducer is denoted by X, the output or input interdigital transducer has two divided interdigital transducers having the electrode finger in which each aperture length is denoted by substantially X/2, and wherein the two divided interdigital transducers are serial-connected, and the electrodes of the respective electrode fingers are led from the two divided interdigital transducers, and are disposed so that two output and input signals connected to a balance terminal pair have a different phase at 180°.

In order to achieve the above object, according to a second aspect of the present invention there is provided a surface acoustic wave device, comprising a plurality of interdigital transducers disposed on a surface acoustic wave propagation path of a piezoelectric substrate, and a reflecting electrode disposed at both the sides, wherein the plurality of interdigital transducers contain a first type of interdigital transducer and a second type of interdigital transducer disposed alternately, wherein when an aperture length of an electrode finger of the first type of interdigital transducer is denoted by X, each of the second type of interdigital transducers has two divided interdigital transducers having an electrode finger in which each aperture length is denoted by substantially X/2, and wherein the first type of interdigital transducer is connected to an unbalanced input or output terminal pair, and the two divided interdigital transducers are serial-connected, and the electrodes of the respective electrode fingers are led from the two divided interdigital transducers, and are connected to a balanced terminal pair, and the respective electrode fingers of the two divided interdigital transducers are disposed so that phases of signals in the balanced terminal pair are different at 180°.

Preferably, in the first or second aspect of the present invention, a position of the electrode finger at a side of connecting with the balanced terminal is mutually slid in half-waves, in the two divided interdigital transducers.

Preferably, in the first or second aspect of the present invention, the connection part of the two divided interdigital transducers is connected to ground.

Preferably, in the second aspect of the present invention, the plurality of interdigital transducers constitute a double mode filter by three interdigital transducers.

Preferably, in the second aspect of the present invention, the plurality of interdigital transducers are five or more interdigital transducers, constituting a multi-electrode filter.

a surface acoustic wave device has two or more filters are cascade-connected, of which the outermost filter is constituted by the surface acoustic wave device according to the above first or second aspect of the present invention, and a balanced terminal pair for an input or output.

Preferably, in the aspect that the two or more filters are cascade-connected, a cascade-connection is conducted between the two or more mutual filters by the plurality of connection parts of the interdigital transducer constituting each filter, and a phase of the filter is reversed in each neighboring connection part of the plurality of connection parts.

Preferably, the piezoelectric substrate may be a 40° to 44° rotated Y-X LiTaO$_3$ in any of the above aspects of the present invention.

More, preferably, the piezoelectric substrate may be a 66° to 74° rotated Y-X LiNbO$_3$ in any of the above aspects of the present invention.

Features of the present invention will become more clear by the following description with reference to the accompanying drawings.

DESCRIPTION OF THE PREFERRED EMBODIMENTS

Hereinafter, embodiments of the present invention will be explained with reference to the drawings. Incidentally, the description of the below embodiments are made for understanding of the present invention, and a scope of a protection of the present invention is not limited to the embodiments, the drawings, and the description thereof.

Figure 1:
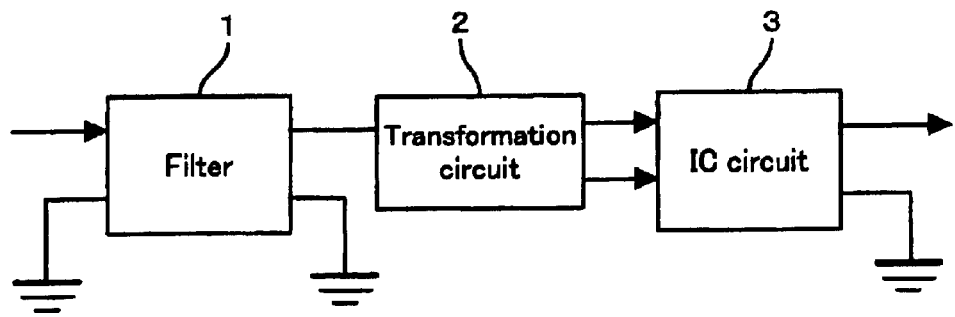
FIG. 1 is a view for explaining the case where a conventional surface acoustic wave device is connected to an IC circuit having a balanced input.
Figure 2:
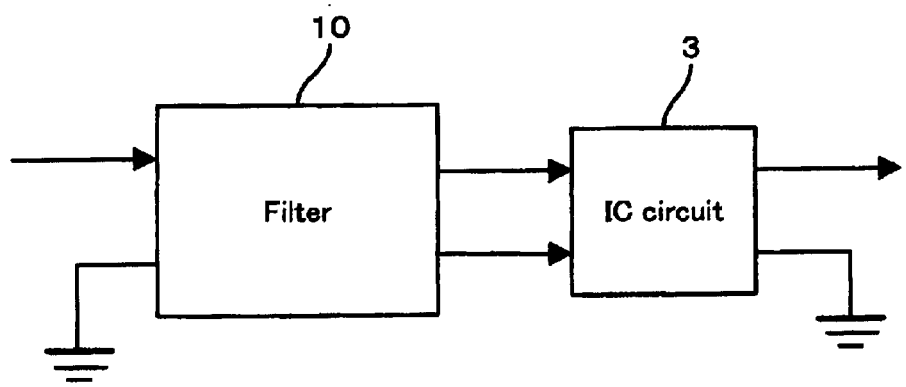
FIG. 2 is a view for explaining the case where a surface acoustic wave device as an object of the present invention is connected to the IC circuit having the balanced input.

FIG. 2 is a view showing an adaptive example of, a surface acoustic wave device 10 according to the present invention as a surface acoustic wave filter, which is lead to a mixer circuit IC 3 similarly to FIG. 1.

The surface acoustic wave filter according to the present invention has an unbalanced-balanced transformation function and an impedance transformation function. Thus, it is possible to set a balanced input of the mixer circuit IC 3 to an input impedance. Accordingly, it is possible not to use the independent unbalanced-balanced transformation function and impedance transformation function circuit, which is necessary in FIG. 1. Thus, it is possible to realize a downsizing of the device.

Figure 3:
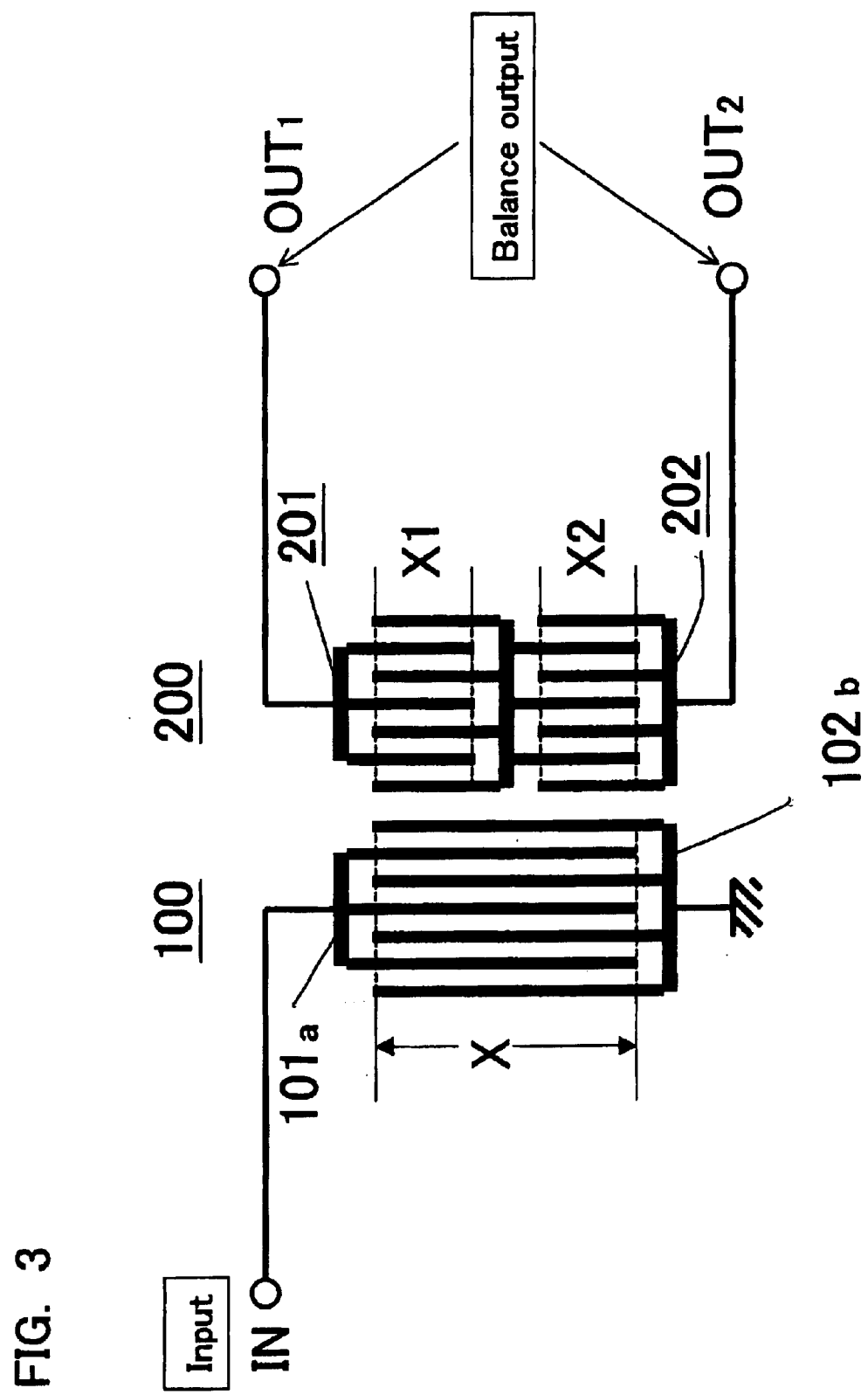
FIG. 3 is a view showing the surface acoustic wave device according to a first embodiment of the present invention.

FIG. 3 shows an electrode structure of the surface acoustic wave device 10 according to a first embodiment of the present invention, for use in one example in FIG. 2.

In FIG. 3, a single input interdigital transducer (IDT) 100 and output interdigital transducer (IDT) 200 are disposed on a propagation path of surface acoustic waves formed on a piezoelectric substrate to be described later in detail.

A first interdigital electrode finger 101$a$ at one side of the input IDT 100 is connected to an input signal terminal IN, and a counter second interdigital electrode finger 101$b$ is grounded. A width X overlapped by the first electrode finger 101$a$ and second electrode finger 101$b$ is an aperture length of the input IDT 100.

On the other hand, the output IDT 200 has first and second divided interdigital transducers (IDT) 201, 202 having aperture lengths $X_1$, $X_2$ substantially half the aperture length X within a range of the aperture length X of the input IDT 100.

One electrode finger of the first divided IDT 201 and one electrode finger of the second divided IDT 202 are connected to balanced output terminal pair OUT1, OUT2, respectively, and further the other electrode fingers of the first and second divided IDTs 201, 202 are configured so as to be commonly connected, respectively.

Here, in particular, the electrode fingers of the first and second IDTs 201, 202 are configured so that the positions are mutually slid by 1 cycle in a position of the electrode finger, namely by ½ of a surface acoustic wavelength.

Figure 4:
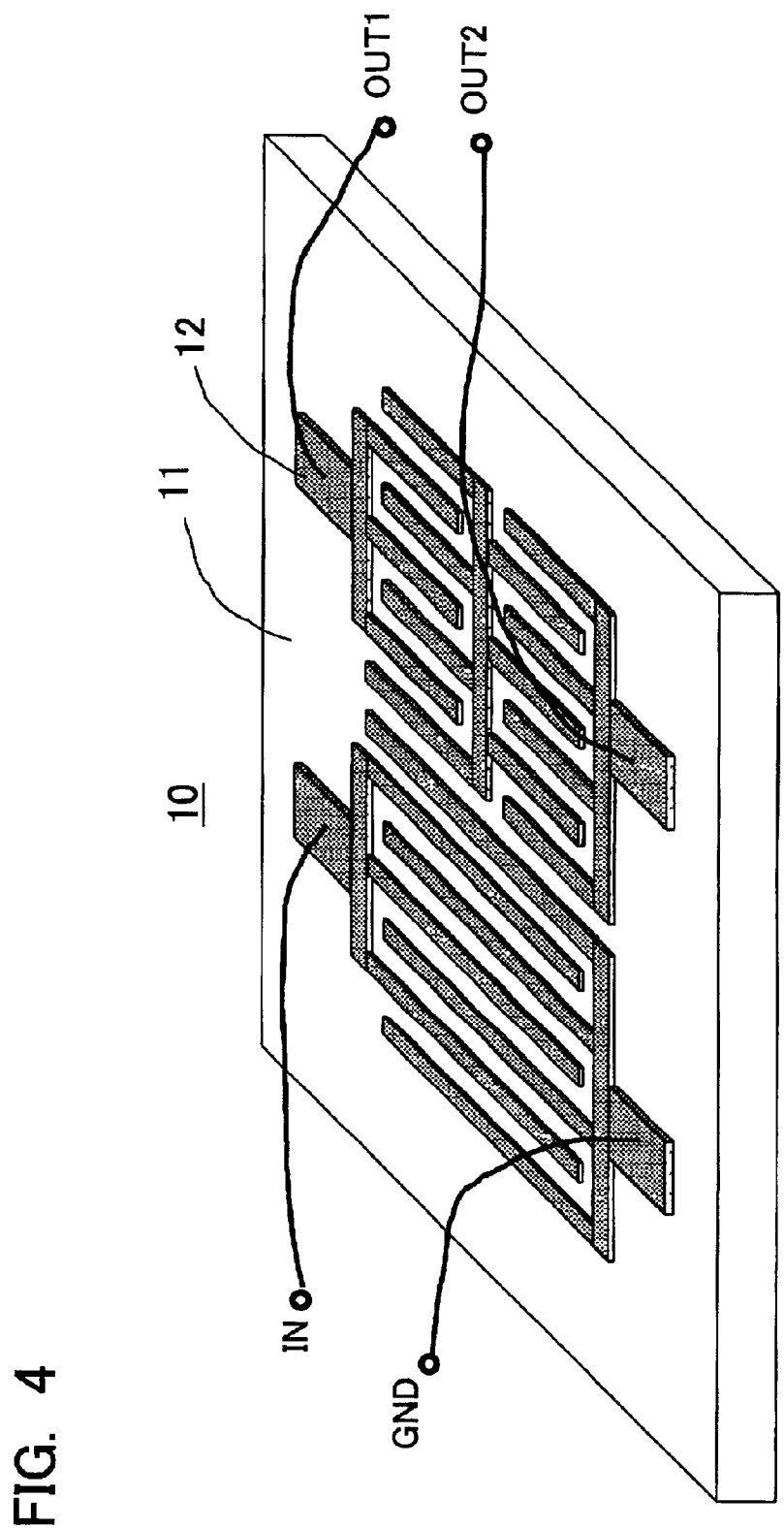
FIG. 4 is a view constituting the surface acoustic wave device in which an electrode structure shown in FIG. 3 is disposed on a piezoelectric substrate 11.

FIG. 4 is a view constituting the surface acoustic wave device in which an electrode structure shown in FIG. 3 is disposed on a piezoelectric substrate 11. Here, the piezoelectric substrate 11 is obtained by cutting out from a crystal body of $LiTaO_3$, or $LiNbO_3$ with a predetermined rotated angle.

In FIG. 4, an input terminal IN, a ground terminal GND, and the output terminals OUT1, OUT2 of the surface acoustic wave device are provided in the exterior of a package (not shown), and each electrode pad 12 formed on the piezoelectric substrate 11 is connected to each terminal by a lead-out wire.

Figure 5:
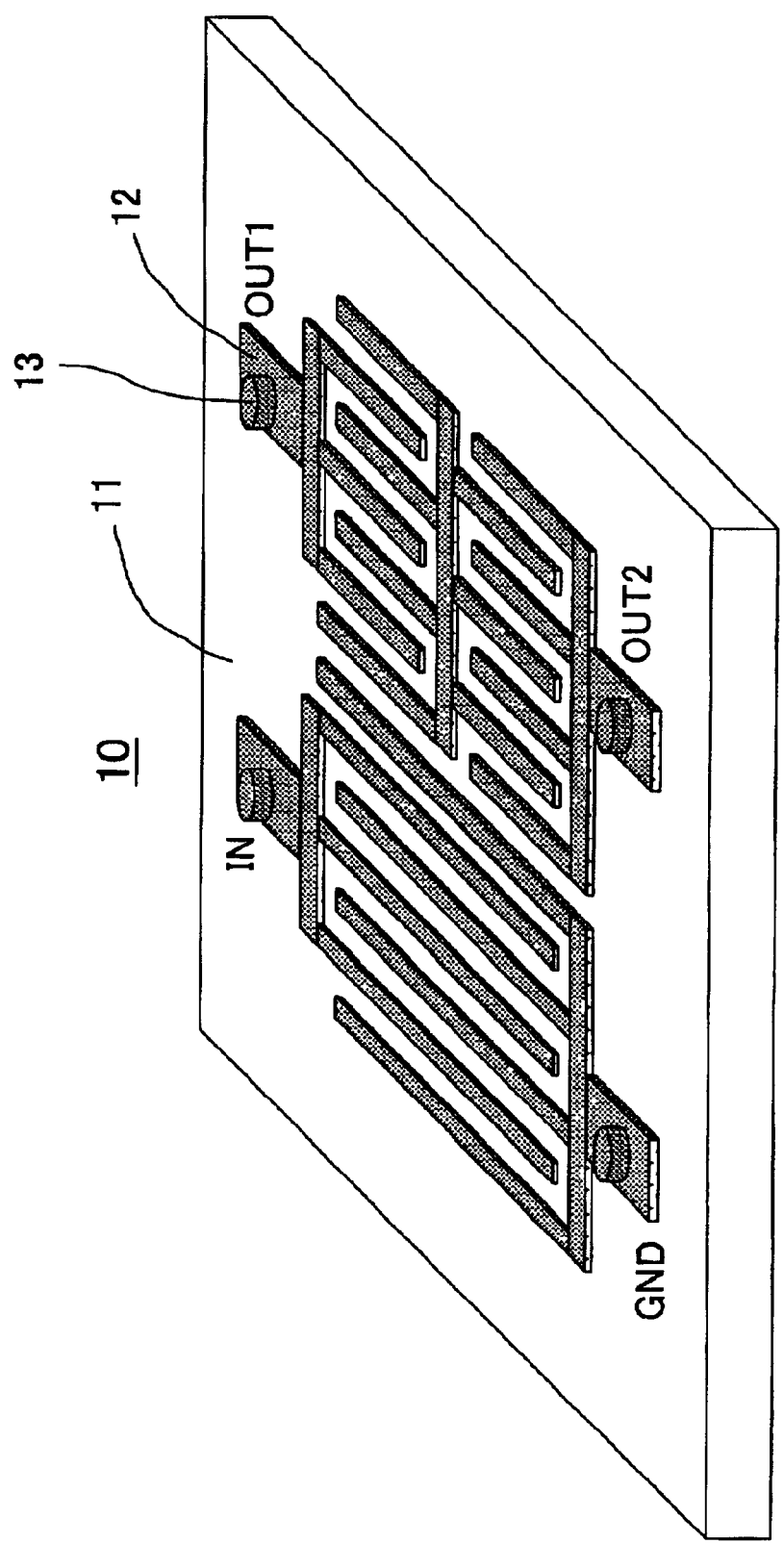
FIG. 5 is a view showing an embodiment showing another terminal structure.

FIG. 5 is an embodiment showing another terminal structure. On the piezoelectric substrate 11, the electrode structure of FIG. 3 is formed similarly to the structure of FIG. 4. This structure differs from FIG. 4 in that the input terminal IN, the ground terminal GND, and the output terminals OUT1, OUT2 are connected to the electrode pads 12 by a bonding chip 13 instead of a connection by the lead-out wire.

Figure 6:
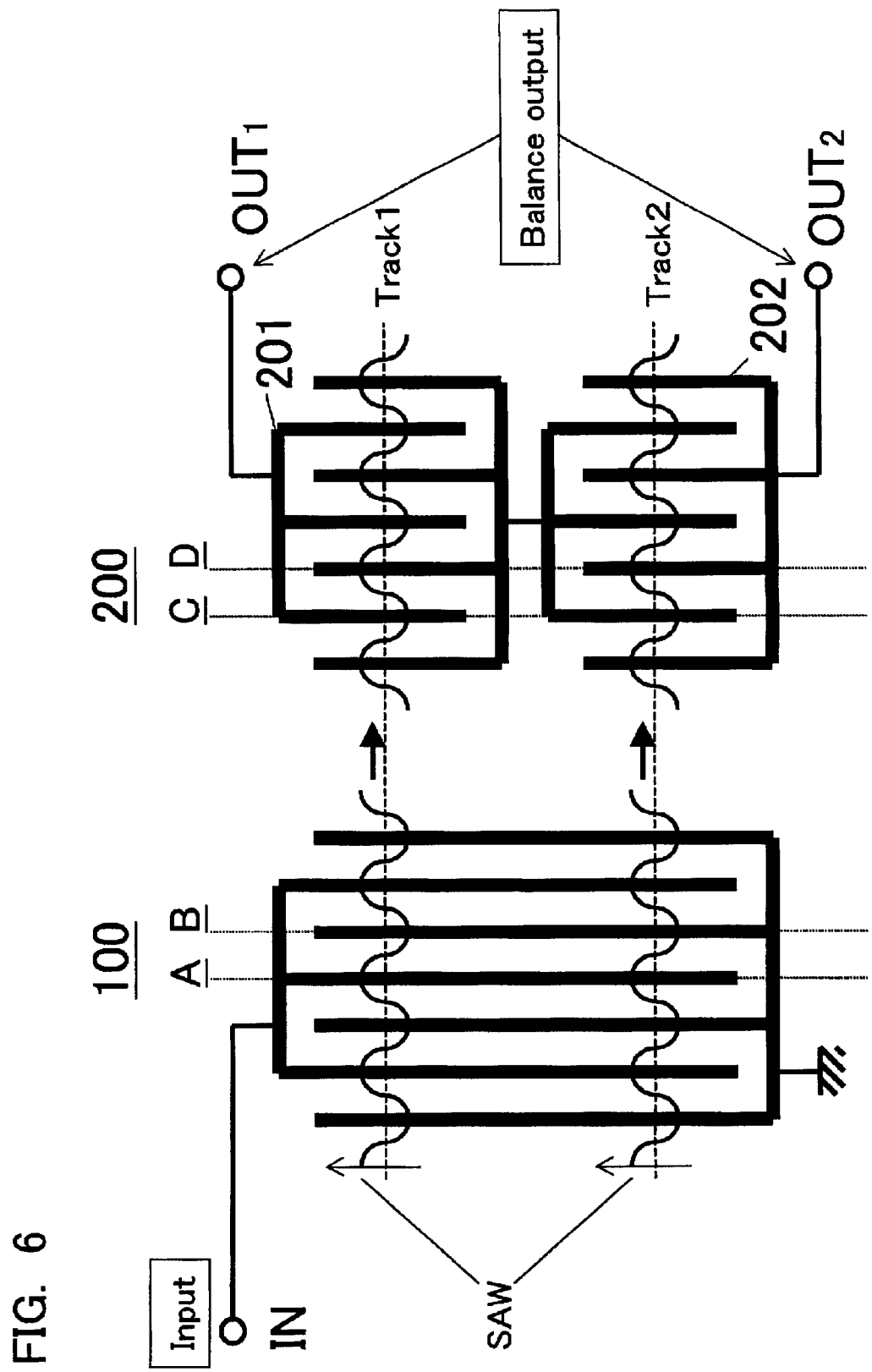
FIG. 6 is a view for explaining operation according to the embodiment of FIG. 3.

FIG. 6 is a view for explaining an operational principle in an electrode structure of FIG. 3, and in particular, typically showing a behavior when the surface acoustic waves (hereinafter SAW) propagate between an input and output. Here, an upside of the two divided output IDTs 201, 202 is called a track 1, and a downside thereof is called a track 2.

A certain moment when the surface acoustic wave device is operating is considered. First, an input electric signal is transformed to the SAW by the input IDT 100. This SAW is propagated on the piezoelectric substrate. Furthermore, the SAW is incident on each of the first and second divided IDTS 201, 202 of the output IDT 200 as the track 1 and track 2. In FIG. 6, each SAW amplitude of the tracks 1, 2 is shown.

When the SAW is incident on the tracks 1, 2, the SAW is transformed again into an electric signal. At this time, the position of the electrode finger is slid at half wavelength between the tracks 1 and 2. For this reason, phases of the electric signal obtained by output terminal pair OUT1, OUT2 are mutually slid at 180°, to which acceptable ±10°~15° deviations may occur.

That is, in the embodiment of FIG. 3, it is apprehensible that a balanced terminal pair is formed between the output terminal pair OUT1 and OUT2, thereby realizing an unbalanced input-balanced output. Next, an I/O impedance will be considered. A capacitance impedance is formed between the electrode fingers of the IDT, and a magnitude of the capacitance impedance is determined according to an interval of the electrode fingers and aperture length.

In FIG. 6, an interval A-B between the electrode fingers of input IDT 100 is equal to an interval C-D of the electrode fingers of the output IDT 200. Accordingly, when the input impedance is 50 Ω, since in the impedance of the IDT 201 at a track 1 side, an aperture length X1 of the IDT 201 is about half the aperture length X of the input IDT 100, the impedance becomes doubled, or about 100 Ω.

On the other hand, the impedance of the IDT 202 at the track 2 side similarly becomes about 100 Ω. Accordingly, when viewed between the balanced output terminal pair OUT1 and OUT2, since the two output IDTs 201, 202 are serial-connected, the entire impedance at the output side becomes about 200 Ω. Thus, it becomes possible to transform the I/O impedance from 50 Ω to 200 Ω.

Figure 7:
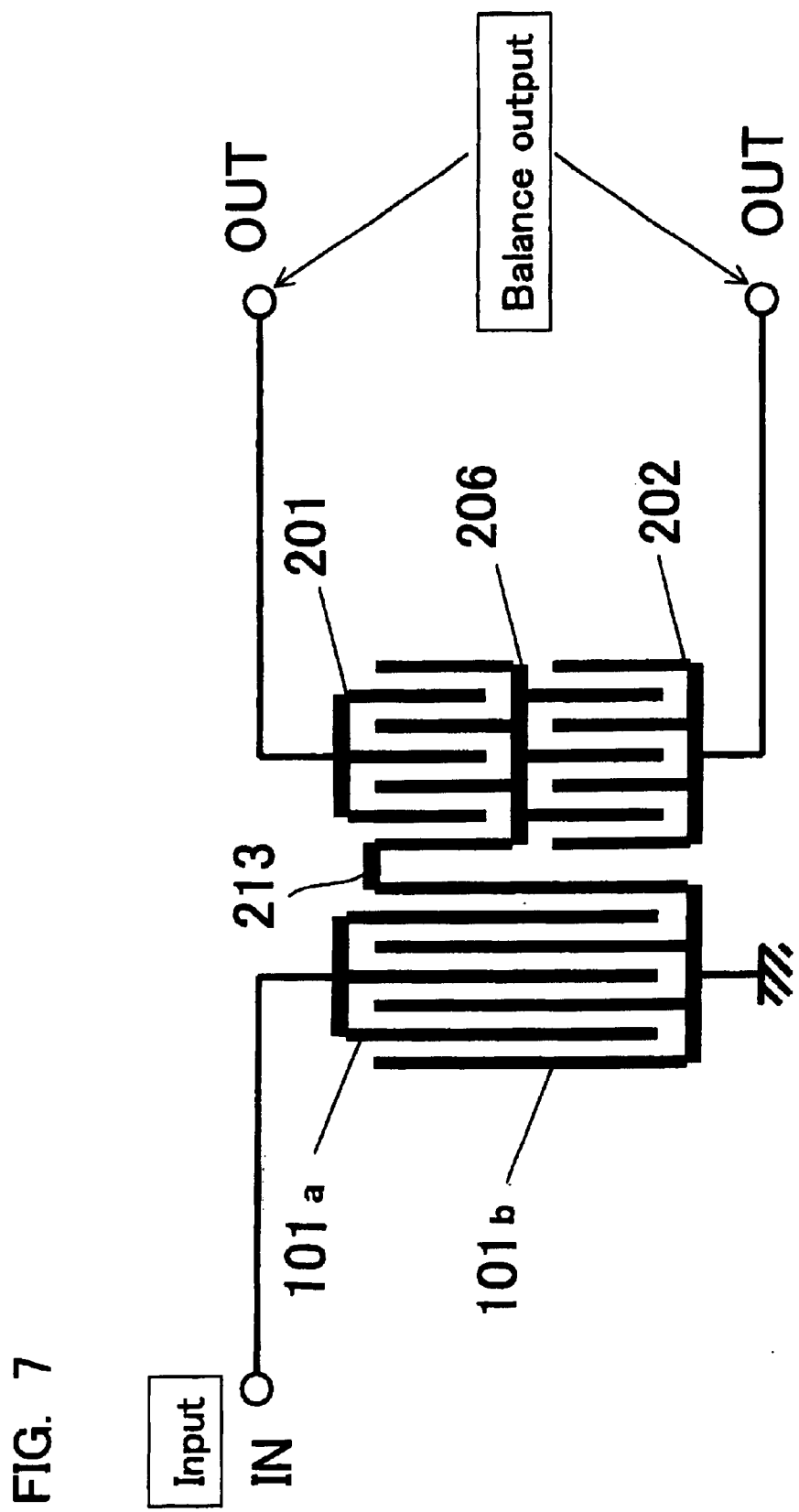
FIG. 7 is a view showing improvements with respect to the electrode structure shown in FIG. 3.

FIG. 7 is a view showing improvement with respect to the electrode structure shown in FIG. 3. In FIG. 7, an electrode of the connection part of the IDT201 and IDT202 is connected to the second electrode finger 101b connected to the ground on one side of the input IDT 100 by the electrode 213. Thus, the electrode of the connection part of the IDT201 and IDT202 is set as the ground.

By forming such the structure, there is an advantage that the phase difference of signals in the balanced output terminal pairs OUT1, OUT2 can be made efficient.

Figure 8:
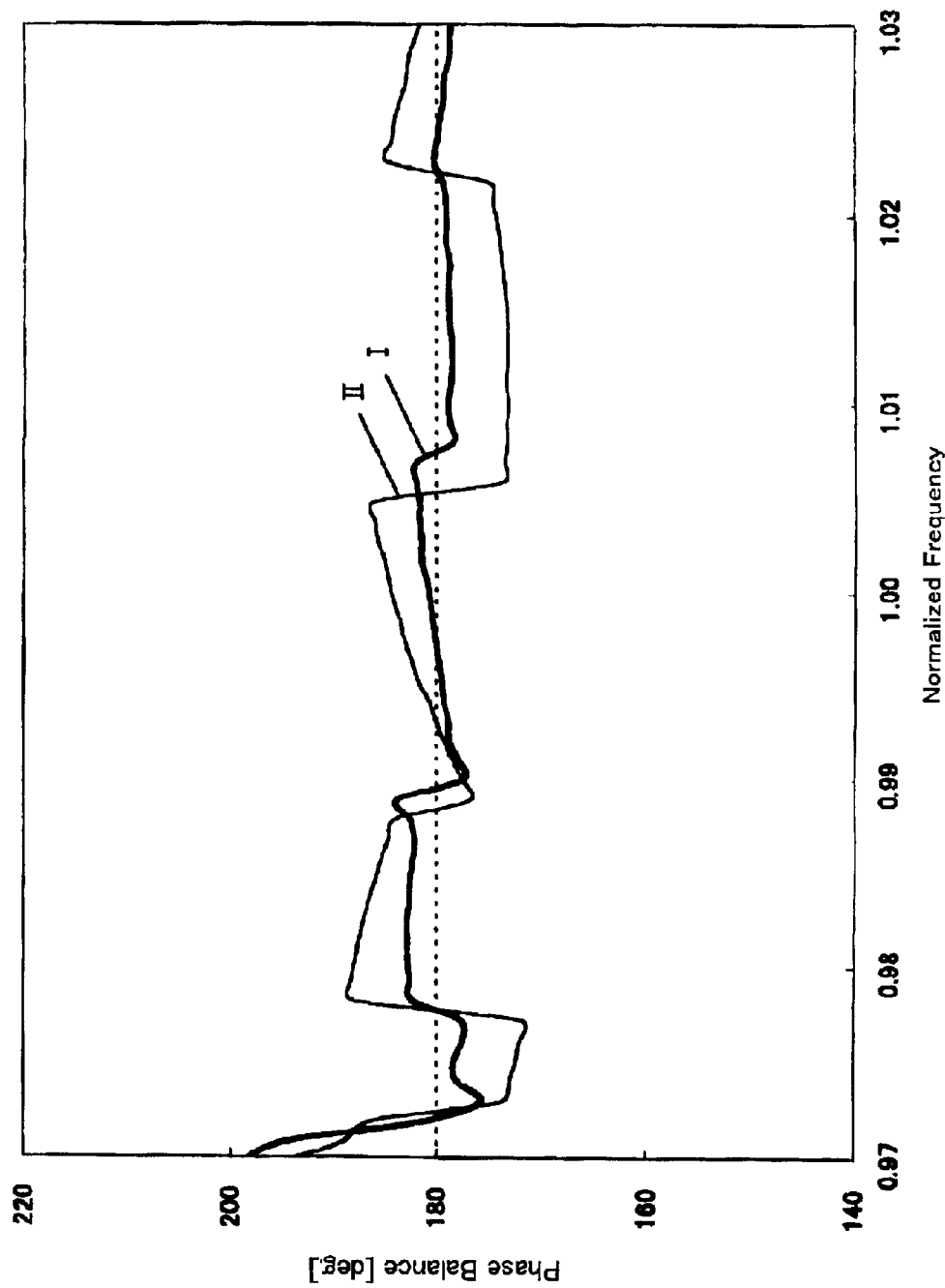
FIG. 8 is data designating improvements in a phase difference between balanced output terminal pair OUT1, OUT2 by forming the electrode structure of FIG. 7.

FIG. 8 is data designating improvements in a phase difference between balanced output terminal pairs OUT1, OUT2 by forming such the electrode structure of FIG. 7. In FIG. 8, the abscissa axis represents a normalized frequency and the ordinate axis represents a phase difference.

In FIG. 8, graph I designates a case where the electrode of the connection part of the IDT 201 and IDT 202 is set as the ground, and graph II designates an example equal to the structure shown in FIG. 3. In FIG. 8, it is proved to be apparent that the electrode of the connection part of the IDT 201 and IDT 202 is set as the ground, whereby the phase difference of the output terminals pair OUT1 and OUT2 can be made small.

Figure 9:
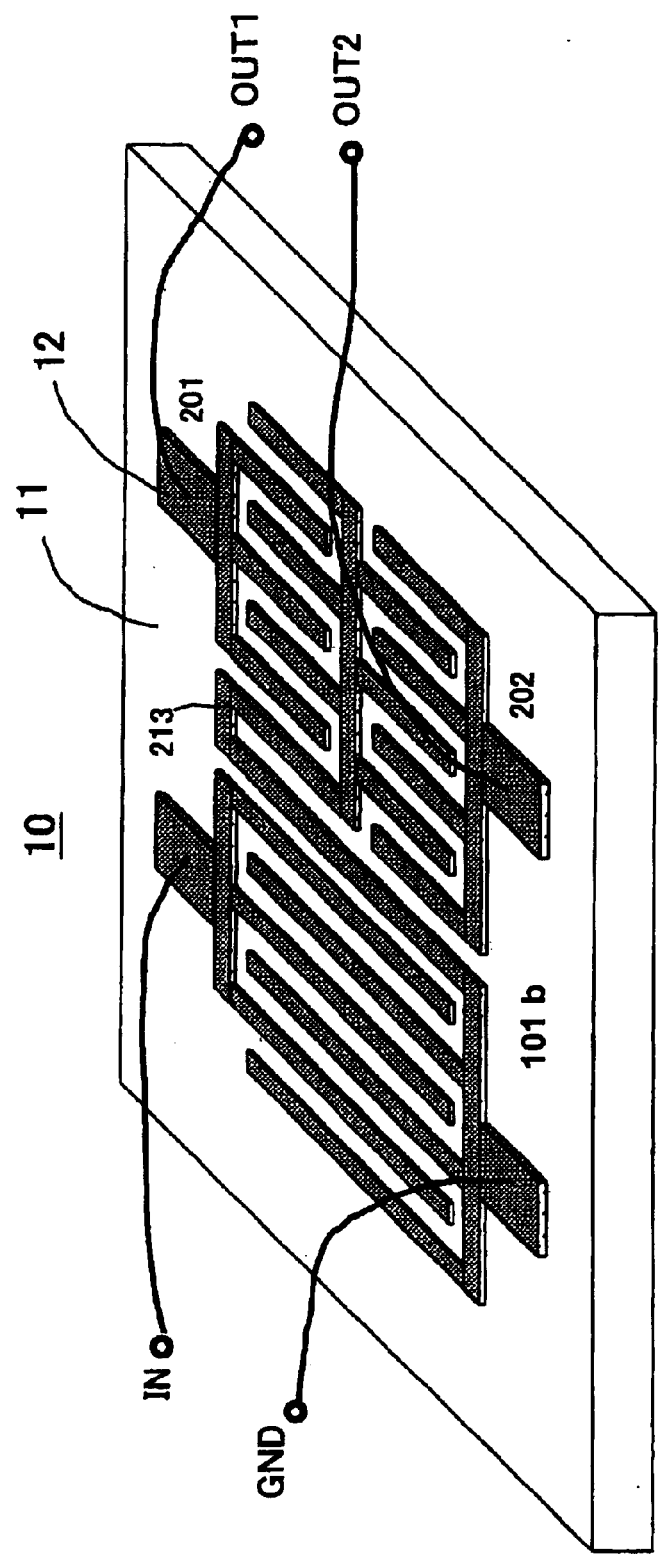
FIG. 9 is a view showing a perspective view of the surface acoustic wave device in which the electrode structure of FIG. 8 is formed on the piezoelectric substrate 11.

FIG. 9 is a view showing a perspective view of the surface acoustic wave device in which such the electrode structure of FIG. 8 is formed on the piezoelectric substrate 11. By the electrode 213 added, the connection part of the IDT 201 and IDT 202 is connected to the second electrode finger 101b of the input IDT 100 linked with the ground.

Here, the electrode 213 functions so that the connection part of the IDT 201 and IDT202 is connected to the ground. Accordingly, it is possible to connect the connection part of the IDT 201 and IDT202 to the ground instead of the electrode 213.

Figure 10:
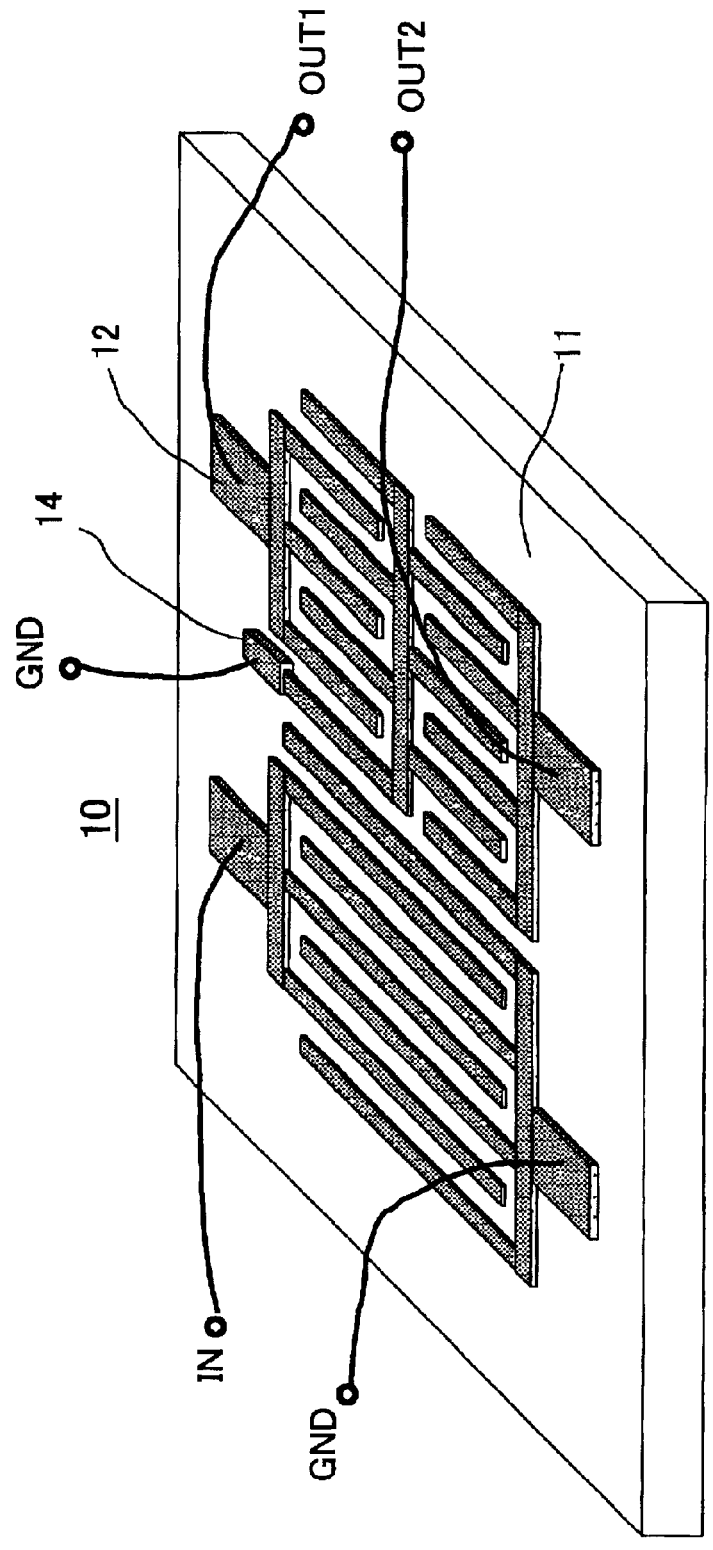
FIG. 10 is a view showing a configuration that a connection part of IDT201 and IDT202 is connected to ground by the other configuration instead of an electrode 213 of FIG. 9.

FIG. 10 is a view showing such other configurations. In the configuration of FIG. 10, an electrode pad 14 linked with the connection part of the IDT 201 and the IDT 202 is provided, and this electrode pad 14 is directly connected to the ground via an electrode lead. With such the configuration, it is possible to reduce the phase difference between the output terminal pair OUT1 and OUT2 as well.

Figure 11:
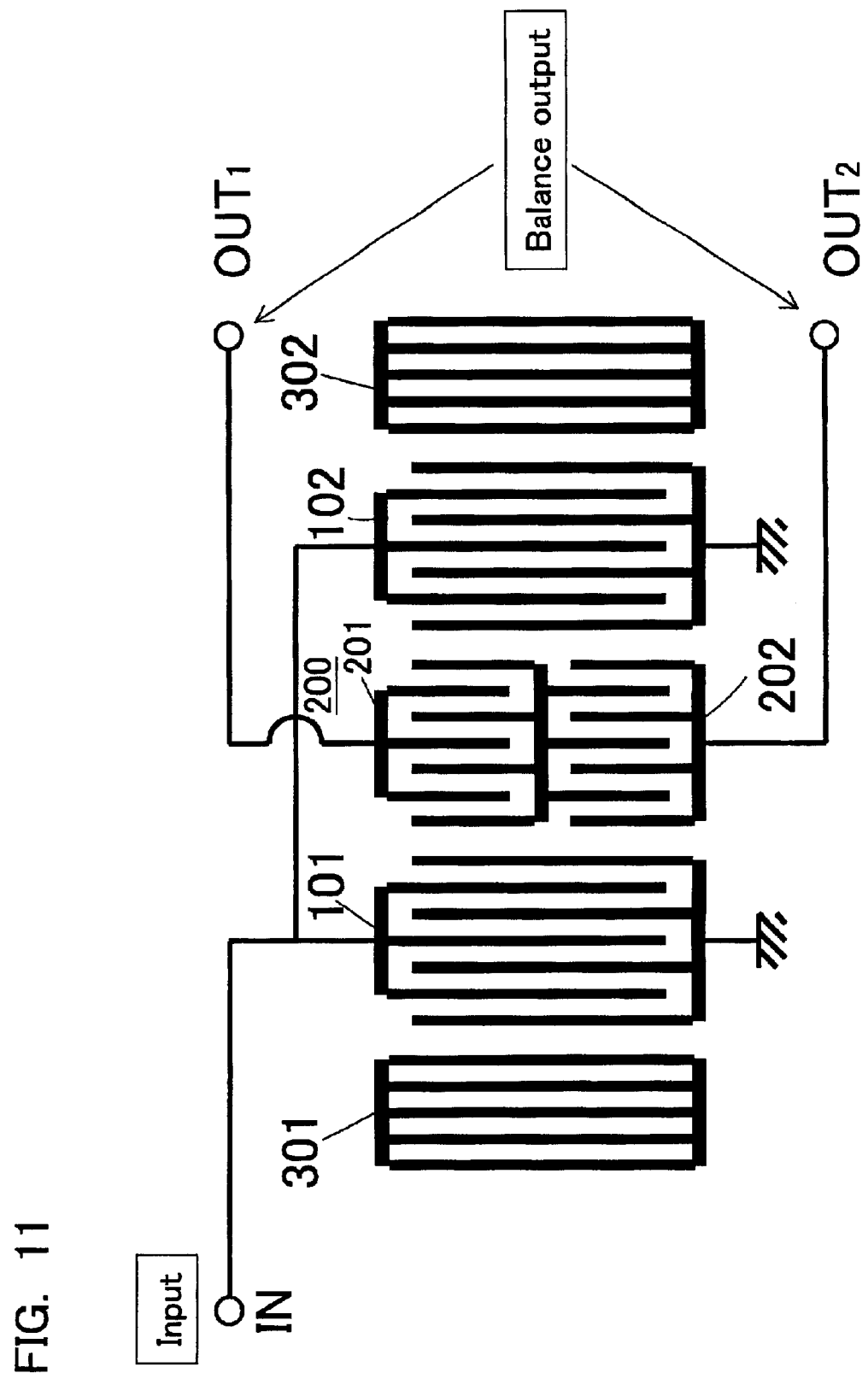
FIG. 11 is a view showing the surface acoustic wave device according to a second embodiment of the present invention.

FIG. 11 is a view showing a second embodiment of the present invention. FIG. 11 shows an electrode finger configuration of the IDT formed on the piezoelectric substrate similarly with FIG. 3. The two input IDTs 101, 102 and the one output IDT 200 so as to be pinched therebetween are disposed. Furthermore, both the sides comprise reflectors 301, 302, forming a so-called double mode filter configuration.

Here, according to the present invention, when the output IDT 200 is divided into the upper and lower two IDTs 201, 202 in the same manner as in the example of FIG. 3, the two signals fetched out therefrom are balance-output between the output terminal pairs OUT1 and OUT2.

In the case where such the double mode filter is used, it is possible to realize an unbalanced-balanced filter of high attenuation.

Furthermore, in the embodiment of FIG. 11 also, the impedance transformation function is same with that described previously in FIG. 6.

Figure 12:
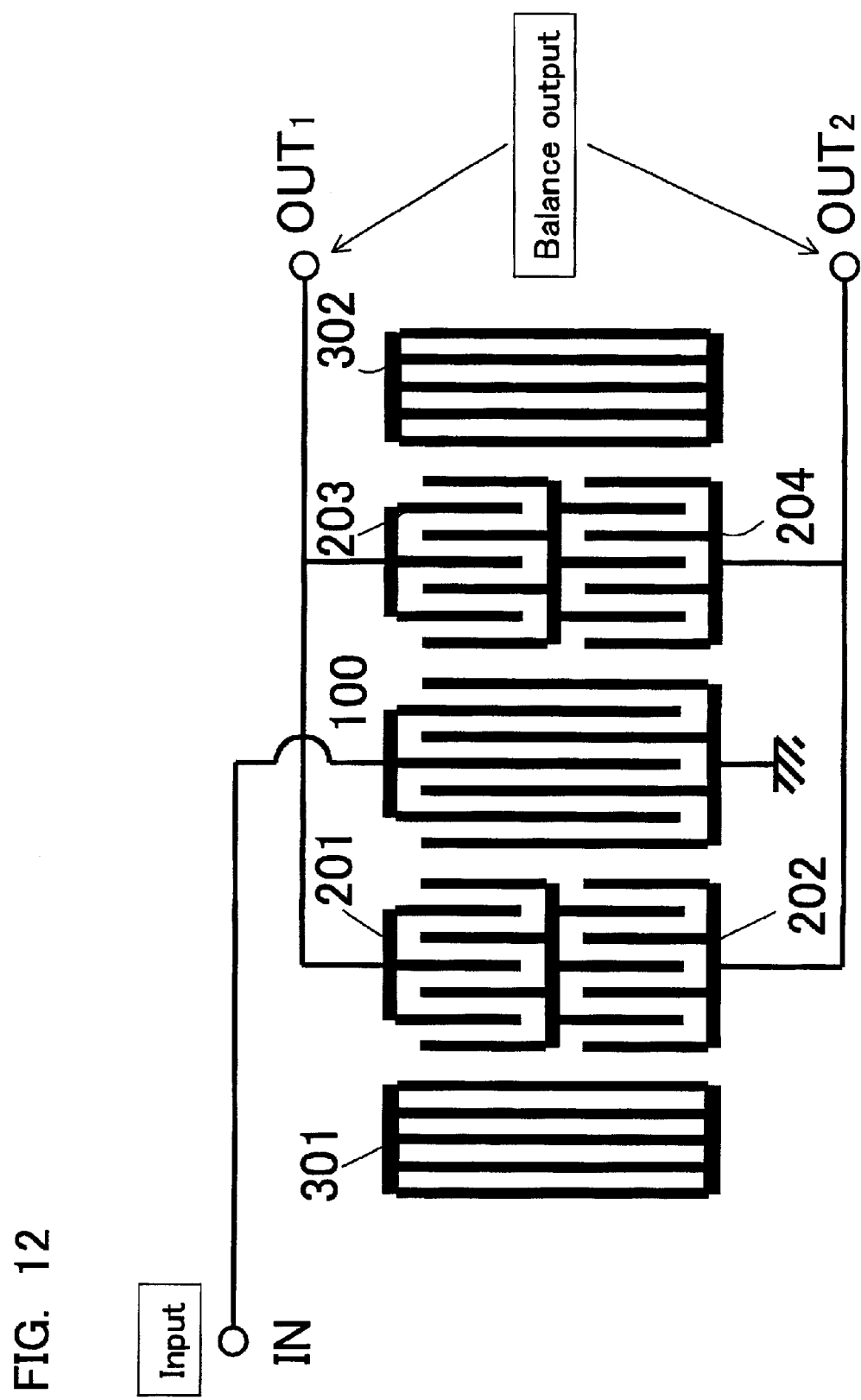
FIG. 12 is a view showing the surface acoustic wave device according to a third embodiment of the present invention.

FIG. 12 shows a third embodiment of the present invention, and shows the electrode finger configuration of the IDT formed on the piezoelectric substrate in the same manner as in the preceding example. This embodiment also has a double mode filter configuration. It is characterized in that two combinations (IDTs 201, 202, and IDTS 203, 204) of the IDTs are used at an output side in opposition to the embodiment of FIG. 11.

According to an embodiment shown in FIG. 12, the same characteristic as in the second embodiment can be obtained, and it is valid in the case where the output impedance is desired to set lower than the second embodiment. That is, as described above, the two combinations (IDTs 201, 202, and IDTs 203, 204) of the IDTs are used, and these are parallel-connected to the balanced output terminal pairs OUT1, OUT2.

Accordingly, when the I/O impedance of the input IDT 100 is 50 Ω, in the embodiment of FIG. 12, the output impedance becomes 100 Ω.

Figure 13:
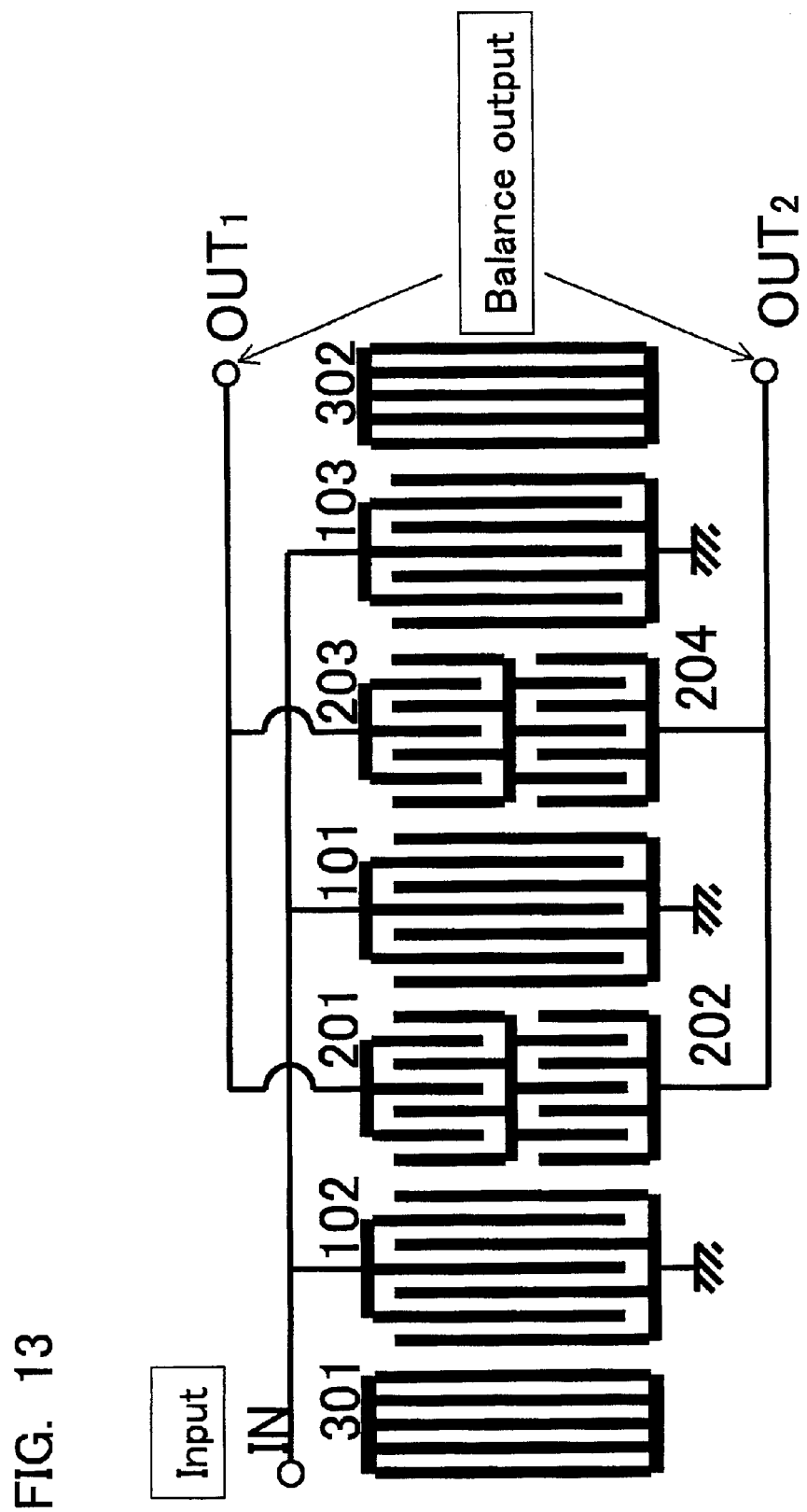
FIG. 13 is a view showing the surface acoustic wave device according to a fourth embodiment of the present invention.

FIG. 13 shows a fourth embodiment of the present invention, and has a multi-electrode type surface acoustic wave filter comprising 5 IDTs, of which the three input IDTs 101 to 103 and two sets of the output IDTs 201 to 202, and 203 to 204 are alternately disposed.

In general, the multi-electrode type can be defined as containing a plurality of (three or more) IDTs. The embodiment of the double mode type of FIGS. 11 and 12 corresponds to the case of containing a minimum piece of IDTS in the multi-electrode type.

Here, in this configuration, each output of the two sets of the output IDTs 201 to 202, and 203 to 204 is led to the balanced output terminal pairs OUT1, OUT2. In the configuration of this embodiment, it is possible to realize a balanced filter of a relatively wide passband width.

Figure 14:
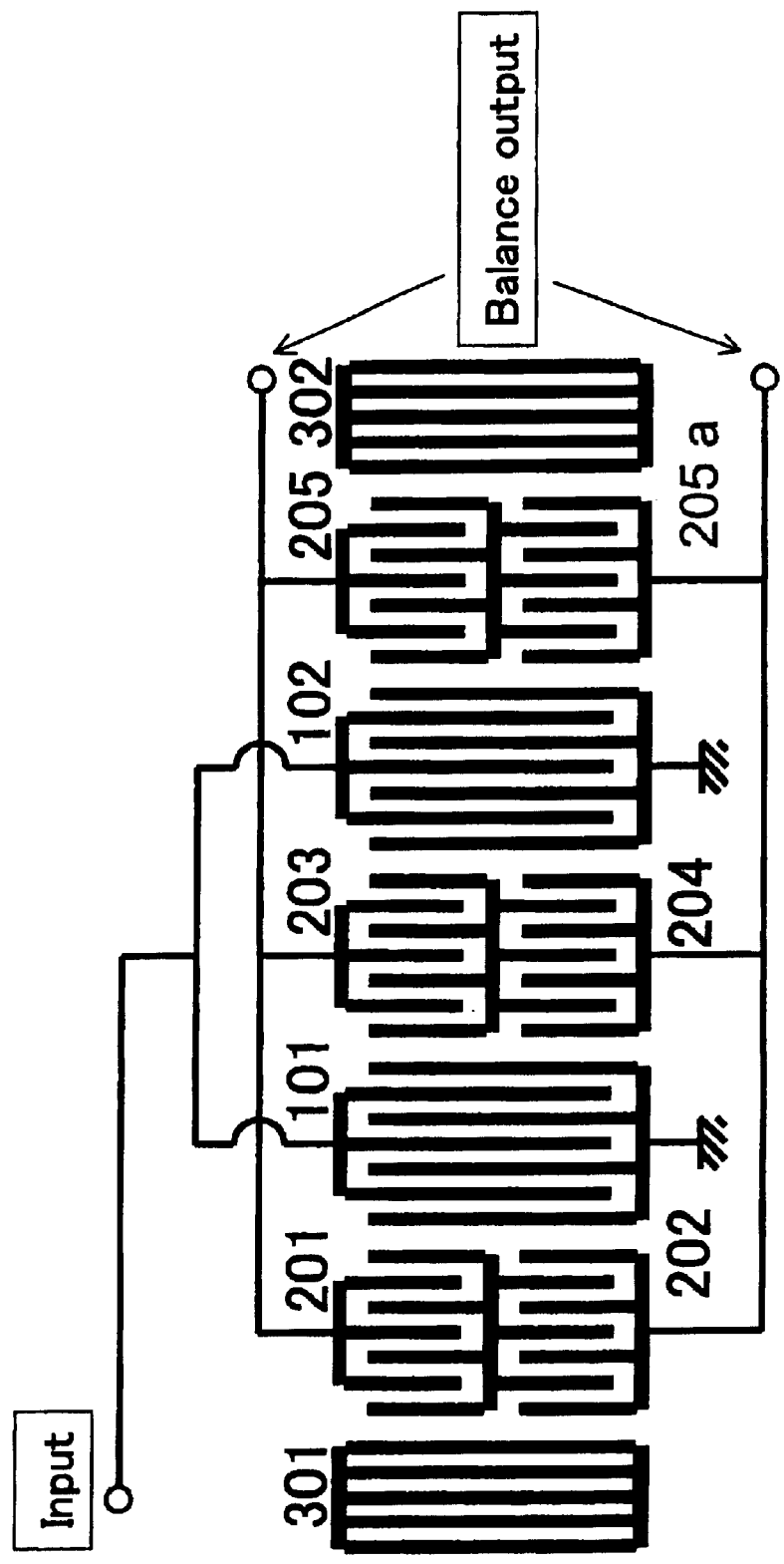
FIG. 14 is a view showing the surface acoustic wave device according to a fifth embodiment of the present invention.

FIG. 14 further shows a fifth embodiment of the present invention, and shows a configuration of the electrode finger of the IDT formed on the piezoelectric substrate in the same manner as in the preceding examples.

The fifth embodiment is same as in the embodiment of FIG. 13 in that the multi-electrode configuration is used, but the three sets of the IDTs 201 to 202, 203 to 204, and 205 to 205a is used at the output side. The same characteristic as in FIG. 13 can be obtained, and it is valid in the case where the output impedance is desired to set lower than the embodiment of FIG. 13.

Figure 15:
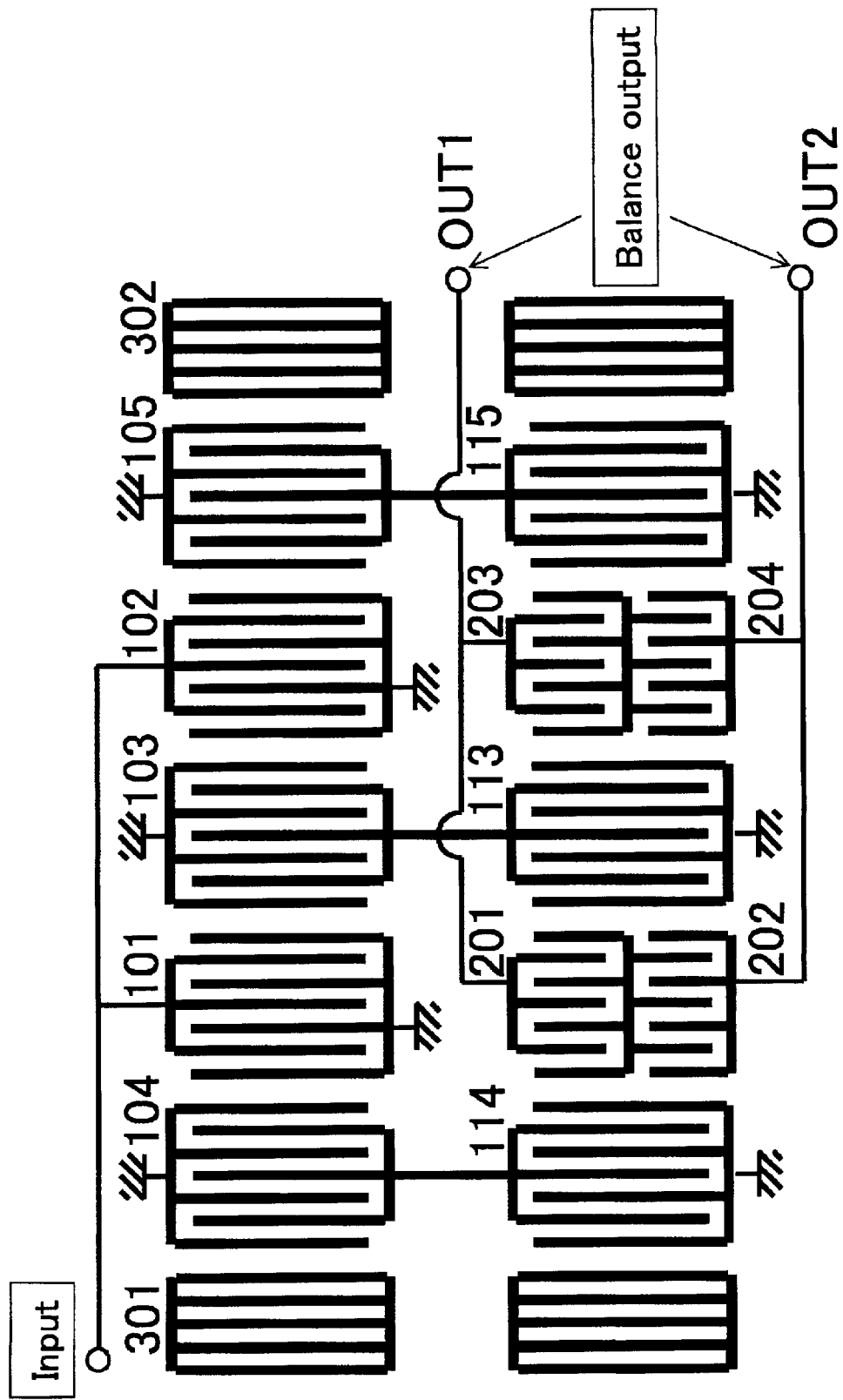
FIG. 15 is a view showing the surface acoustic wave device according to a sixth embodiment of the present invention.

FIG. 15 shows a sixth embodiment of the present invention, and shows a configuration of the electrode finger of the IDT formed on the piezoelectric substrate in the same manner as in the preceding example. The multi-electrode type filter is configured by two-stage cascade-connection. That is, first stage IDTs 103 to 105 are cascade-connected to second stage IDTs 113 to 115.

Furthermore, as the output IDT of the filter at the second stage, the two sets of IDTs 201 to 202, and 203 to 204 are used. The output of the two sets of IDTS 201 to 202, and 203 to 204 is fetched out to the balanced output terminal pairs OUT1, OUT2.

When such the configuration is used, since the cascade connection is made at the first stage and second stage, it is advantageous that an attenuation amount can be largely taken.

Figure 16:
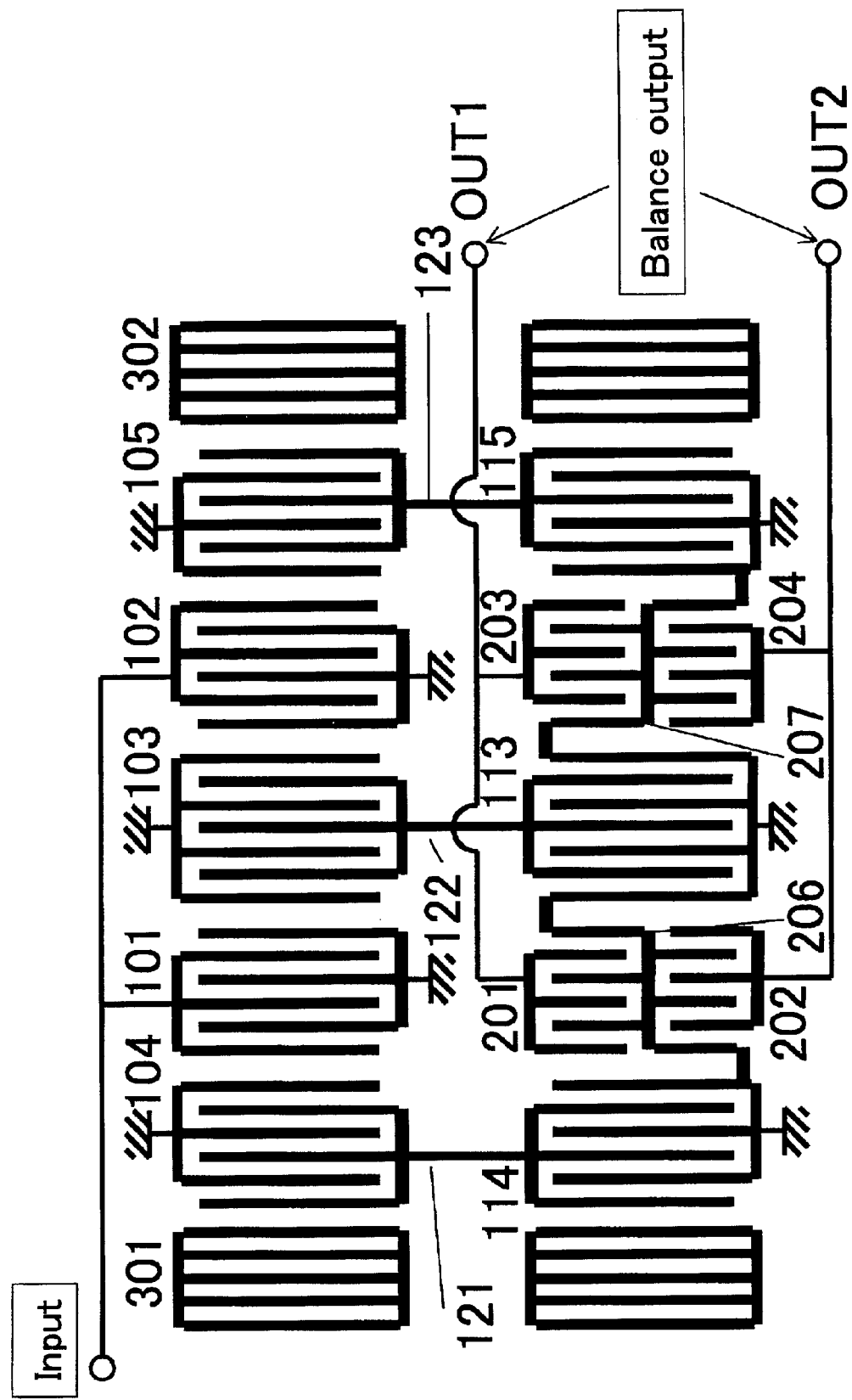
FIG. 16 is a configuration of an embodiment improving the phase difference between signals in the balanced output terminal pair OUT1, OUT2 with respect to the embodiment of FIG. 15.

FIG. 16 is a configuration of an embodiment improving the phase difference between signals in the balanced output terminal pairs OUT1, OUT2 with respect to the embodiment of FIG. 15. A common electrode 206 of the divided IDTs 201, 202 and a common electrode 207 of the divided IDTs 203, 204, linked with the balanced output terminal pairs OUT1, OUT2 are connected to the ground.

Incidentally, the common electrodes are connected to the ground through the neighboring IDTs 114, 113 and IDTs 113, 115 on both sides of the common electrode 206 and the common electrode 207, and this reinforces the grounding more.

In the electrode structure shown in FIG. 16, when electrode intervals are equalized, phases of signals in electrodes 121, 122 connecting the first step to the second step differ at 180°, mutually. Furthermore, phases of signals in electrodes 122, 123 differ at 180°, mutually.

Accordingly, if using such the structure, as a distance of the electrodes 121–123 in which the signals are input into the balanced output terminal pair OUT1 and the second step is equalized to that of the electrodes 121–123 in which the signals are input into the balanced output terminal pair OUT2 and the second step, there is an advantage that the phase difference between the signals in the balanced output terminal pair OUT1, OUT2 is made efficient.

Figure 17:
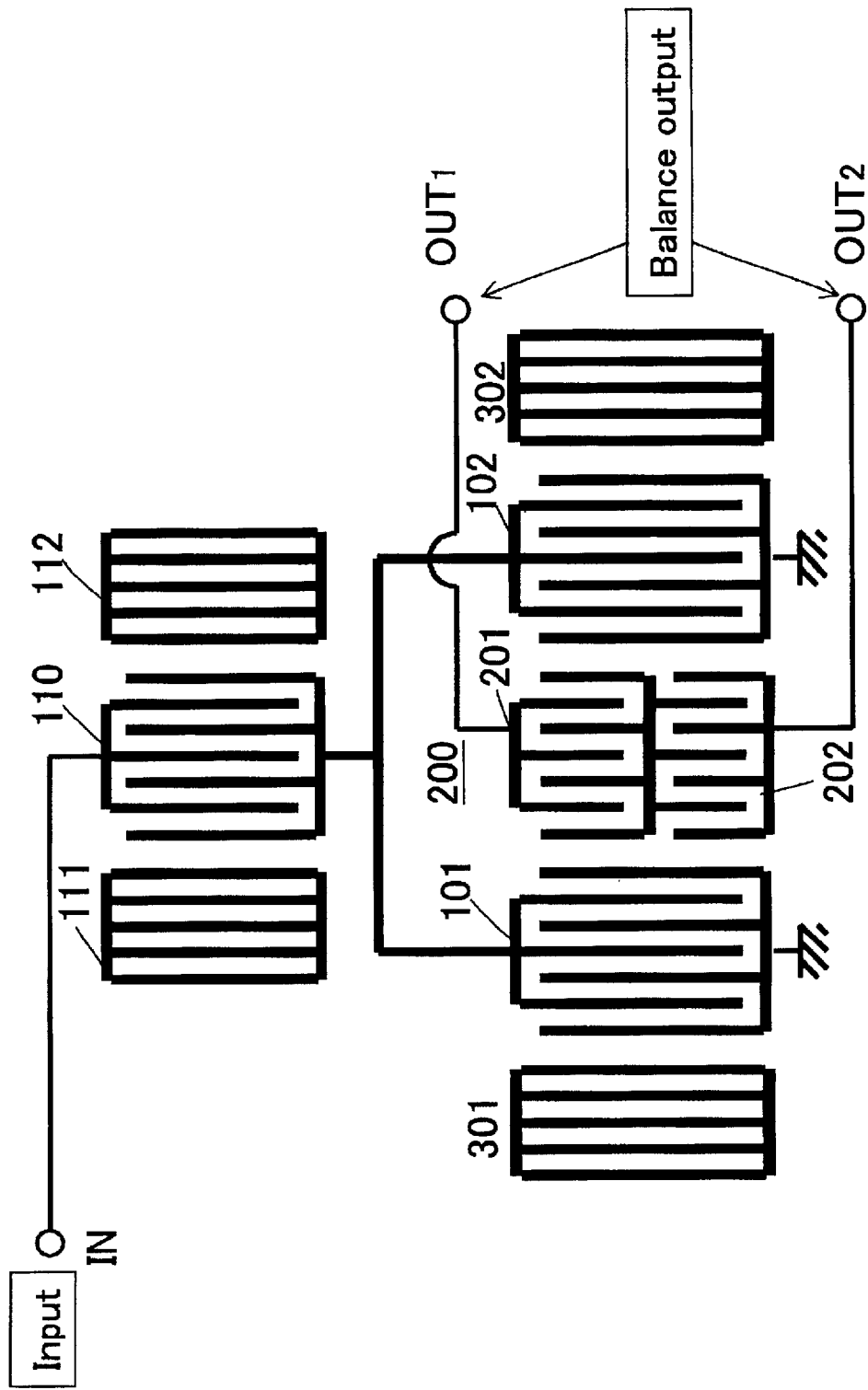
FIG. 17 is a view showing the surface acoustic wave device according to a seventh embodiment of the present invention.

FIG. 17 shows a seventh embodiment of the present invention, and shows a configuration of the electrode finger of the IDT formed on the piezoelectric substrate in the same manner as in the preceding examples. The seventh embodiment has the same configuration as in the embodiment of FIG. 11 in that serial-resonators configured so as to have an IDT 110 and reflecting IDTS 111, 112 at an input side of the double mode filter are cascade-connected.

This embodiment is characterized in that, by setting appropriately frequencies of the serial resonator, the attenuation amount at a side of high frequencies in the vicinity of a passband can be largely taken.

Figure 18:
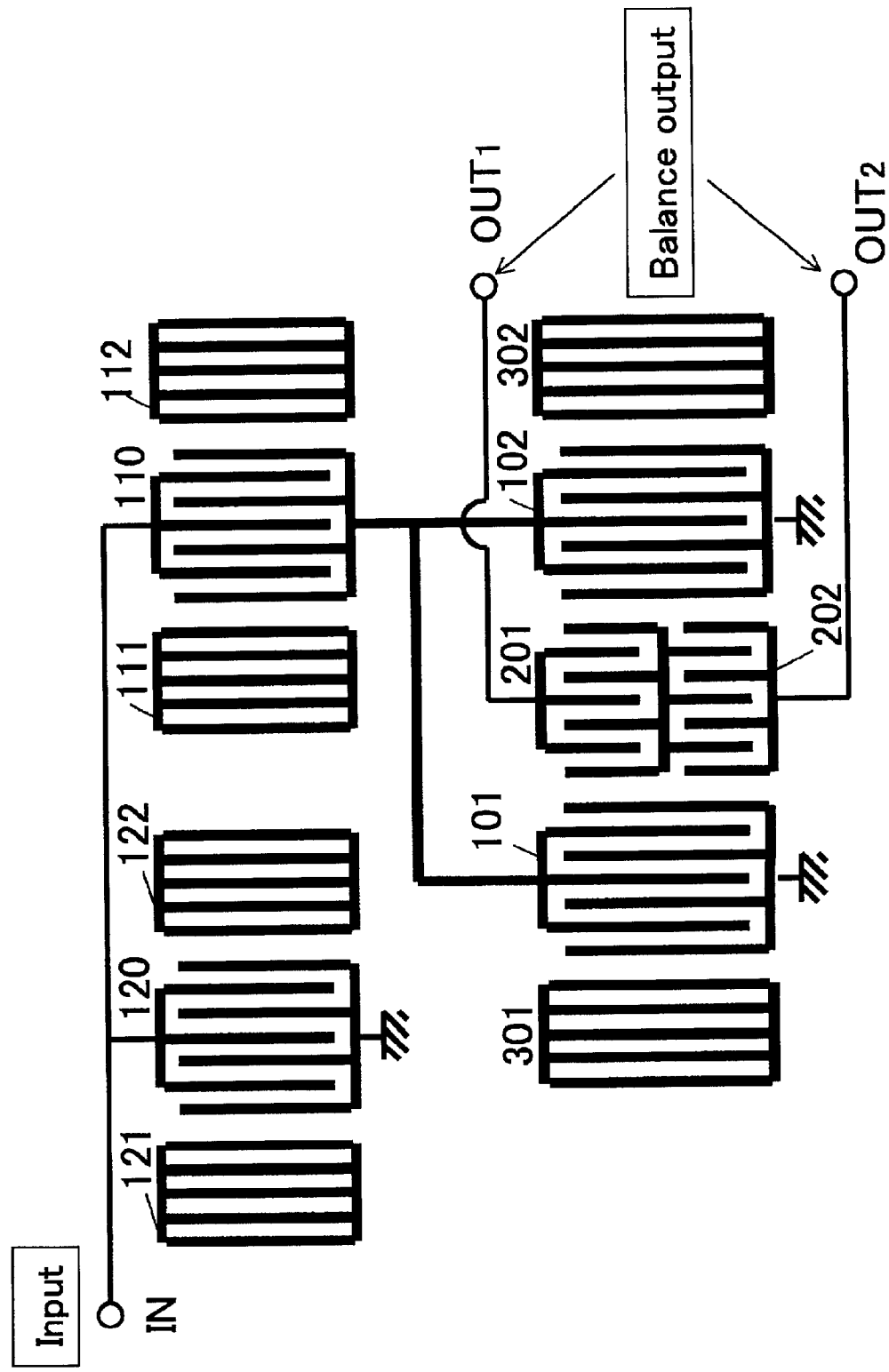
FIG. 18 is a view showing the surface acoustic wave device according to an eighth embodiment of the present invention.

FIG. 18 shows an eighth embodiment of the present invention, and shows a configuration of the electrode finger of the IDT formed on the piezoelectric substrate in the same manner as in the preceding examples. The embodiment of FIG. 18 is extended the embodiment of FIG. 17, and is configured so that the serial resonators configured having an IDT 120 and reflecting IDTs 121, 122 are further parallel-connected, with respect to the serial resonator configured having the IDT 110 and the reflecting IDTs 111, 112 which are cascade-connected to a so-called ladder type filter at the input side of the double mode filter.

In this configuration, the attenuation amount in the vicinity of the band can be largely taken without so deteriorating an insertion loss in a passing band, and a balanced filter can be realized.

Figure 19:
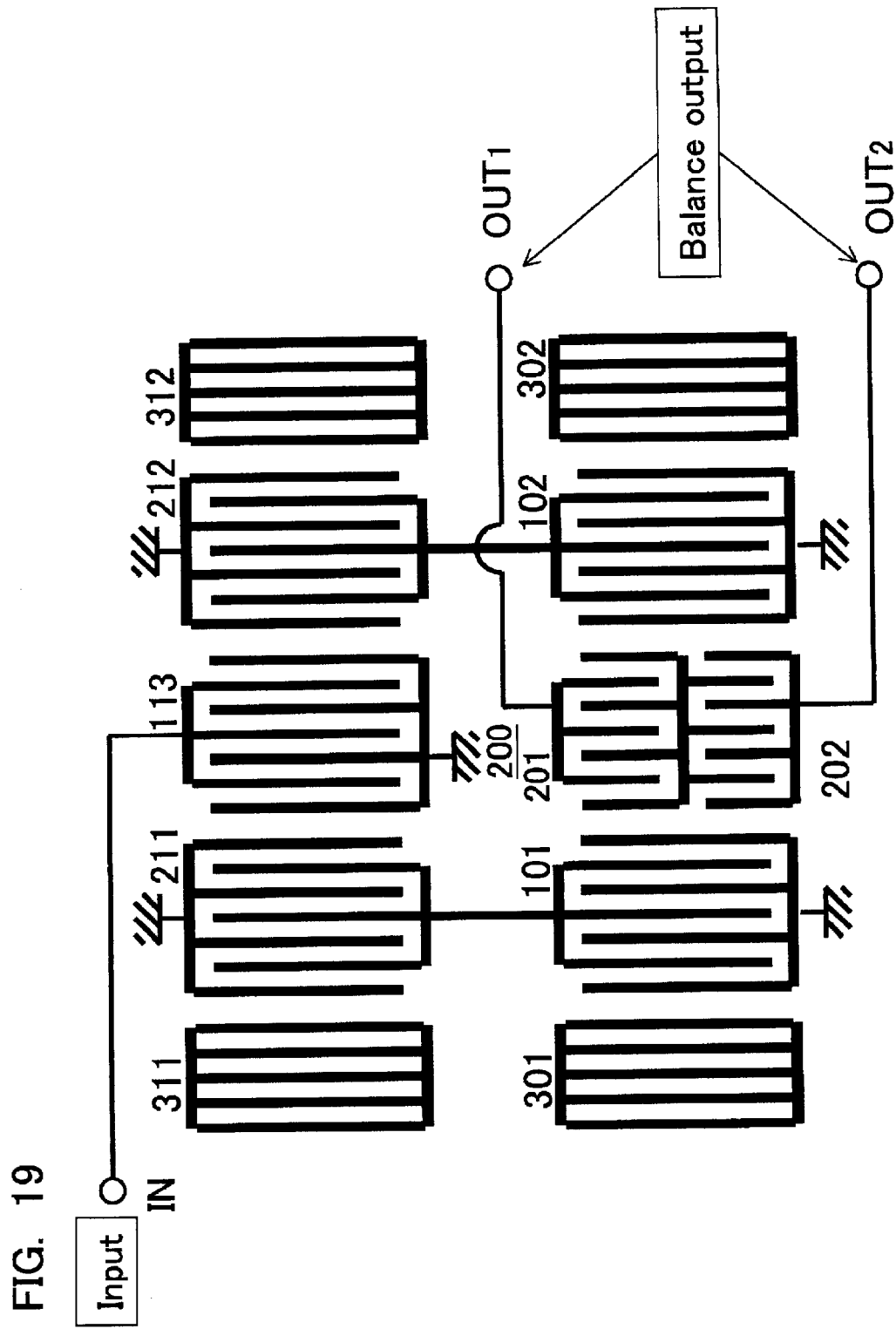
FIG. 19 is a view showing the surface acoustic wave device according to a ninth embodiment of the present invention.

FIG. 19 shows a ninth embodiment of the present invention, and shows a configuration of the electrode finger of the IDT formed on the piezoelectric substrate in the same manner as in the preceding examples. The double mode filter is cascade-connected. The double mode filter at a first stage is configured by an IDT 113 connected to an input terminal IN, output IDTs 211, 212, and reflecting IDTs 311, 312.

The output IDTs 211, 212 of the double mode filter at a first stage are connected to the input IDTs 101, 102 of the double mode filter at a second stage. This embodiment is configured so that an output IDT 200 of the filter at a second stage is divided into the IDTS 201, 202.

In this embodiment, the insertion loss of the passband is small, and it is possible to realize the balanced filter having high attenuation characteristic.

Figure 20:
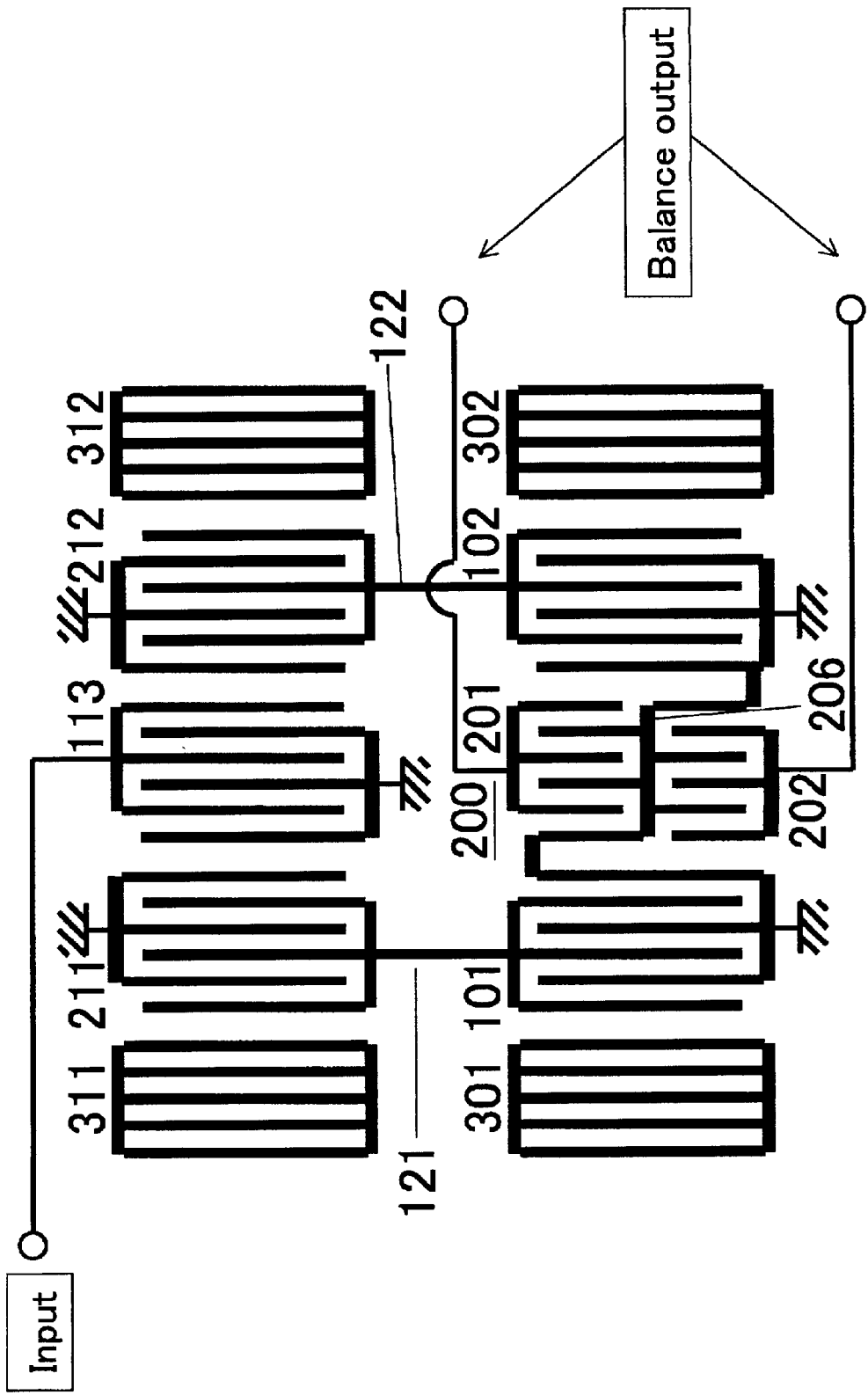
FIG. 20 is an embodiment improving a phase difference between the balanced output terminal pair OUT1, OUT2 in the embodiment of FIG. 19.

FIG. 20 is an embodiment improving the phase difference between the balanced output terminal pair OUT1, OUT2 in the embodiment of FIG. 19. Similarly to the embodiment of preceding FIGS. 7 and 16, the common electrode 206 of the divided IDTs 201, 202 is connected to the ground.

By equalizing each electrode interval, the phases of the signals in the electrodes 121, 122 connecting each step differ at 180°, mutually. With such the configuration, as a distance of the electrodes 121–122 in which the signals are input into the balanced output terminal pair OUT1 and the second step is equalized to a distance of the electrodes 121–122 in which the signals are input into the balanced output terminal pair OUT2 and the second step, the phase difference between signals in the balanced output terminal pair OUT1, OUT2 is improved similarly as shown in FIG. 8.

Here, in the respective embodiments, the description was made that the electrode fingers configuring the IDTs are formed and disposed on the piezoelectric substrate which was cut out from a crystal such as LiTaO$_3$, LiNbO$_3$, or the like. As the piezoelectric substrate in which a loss of the surface acoustic waves which can propagate is minimized, and which has a wide band width, these inventors, etc. have proposed previously the piezoelectric substrate in Japanese Patent Application Laid-Open No. 8-179551. Accordingly, it is desirable that the piezoelectric substrate such-proposed previously is also used in the present invention.

This preferable piezoelectric substrate is a 40° to 44° rotated Y-X LiTaO$_3$, which is cut out from LitaO$_3$ single crystal rotated around the X axis at a rotated angle from the Y axis to the Z axis, the rotated angle being in a range between 40° and 44°. A 66° to 74° rotated Y-X LiNbO$_3$ is also preferable, which is cut out from LiNbO$_3$ single crystal rotated around the X axis at a rotated angle from the Y axis to the Z axis, the rotated angle being in a range between 66° and 74°.

Furthermore, the description was made that the input side is unbalanced and the output side is balanced as how to use the surface acoustic wave device in the respective embodiments, but this is reversible, and it is also possible that the input side of the surface acoustic wave device according to the present invention is balanced, and the output side thereof is unbalanced for adaptation.

As the embodiments were described above with reference to the drawings, according to the present invention, it is possible to realize the surface acoustic wave device having an unbalanced-balanced transformation function, and the impedance transformation function between the unbalanced-balanced terminals.

Thus, it is possible to provide a small-sized configuration of the communication device, etc. on which the surface acoustic wave device is mounted.

What is claimed is:

1. A surface acoustic wave device, comprising:

first and second stages, which are cascade-connected, the first stage having a plurality of interdigital transducers of a first type disposed on a surface acoustic wave propagation path of a piezoelectric substrate, and the second stage having a plurality of interdigital transducers disposed on the surface acoustic wave propagation path, wherein the plurality of interdigital transducers of the second stage include interdigital transducers of the first type and Interdigital transducers of a second type, which are disposed alternately, wherein when an aperture length of an electrode finger of the interdigital transducers of the first type is denoted by X, each of the interdigital transducers of the second type has two divided interdigital transducers each having an electrode finger in which each aperture length is denoted by substantially X/2, and wherein the interdigital transducers of the first stage are connected to an unbalanced input or output terminal pair, and two divided interdigital transducers of the second type are serial-connected, and the electrodes of the respective electrode fingers are led from the two divided interdigital transducers, and are connected to a balanced output or input terminal pair, and the respective electrode fingers of the two divided interdigital transducers are disposed so that phases of signals in the balanced terminal pair are different at 180°, and wherein the interdigital transducers of the first type of the first and second stages are cascade-connected to each other in a plurality of connection parts of the interdigital transducers, and a phase of the interdigital transducers of the first type is reversed in each neighboring connection part of the plurality of connection parts.

2. The surface acoustic wave device according to claim 1, wherein the plurality of interdigital transducers are five or more interdigital transducers, constituting a multi-electrode filter.

3. The surface acoustic wave device according to claim 1, wherein in the two divided interdigital transducers, relative positions of the electrode fingers at a side of connecting with the corresponding balanced terminal are mutually slid in half-wavelengths.

4. The surface acoustic wave device according to claim 1, wherein the plurality of interdigital transducers constitute a double mode filter by three interdigital transducers.

5. The surface acoustic wave device according to claim 1, wherein the piezoelectric substrate is a 40° to 44° rotated Y-X $LiTaO_3$.

6. The surface acoustic wave device according to claim 1, wherein the piezoelectric substrate is a 66° to 74° rotated Y-X $LiNbO_3$.

* * * * *